US011505859B1

(12) United States Patent
Nielson

(10) Patent No.: US 11,505,859 B1
(45) Date of Patent: Nov. 22, 2022

(54) OPHTHALMIC SUBSTRATE CONVEYOR AND METHOD OF CONVEYING OPHTHALMIC SUBSTRATES FOR VACUUM DEPOSITION

(71) Applicant: QUANTUM INNOVATIONS, INC., Central Point, OR (US)

(72) Inventor: Wade E. Nielson, Central Point, OR (US)

(73) Assignee: QUANTUM INNOVATIONS, INC., Central Point, OR (US)

( * ) Notice: Subject to any disclaimer, the term of this patent is extended or adjusted under 35 U.S.C. 154(b) by 823 days.

(21) Appl. No.: 16/449,367

(22) Filed: Jun. 22, 2019

Related U.S. Application Data

(60) Provisional application No. 62/735,690, filed on Sep. 24, 2018.

(51) Int. Cl.

| | |
|---|---|
| ***C23C 14/24*** | (2006.01) |
| ***B65G 47/90*** | (2006.01) |
| ***B29D 11/00*** | (2006.01) |
| ***C23C 14/50*** | (2006.01) |
| ***C23C 14/00*** | (2006.01) |
| ***C23C 16/00*** | (2006.01) |

(52) U.S. Cl.
CPC .......... *C23C 14/24* (2013.01); *B29D 11/0023* (2013.01); *B29D 11/00153* (2013.01); *B65G 47/907* (2013.01); *C23C 14/00* (2013.01); *C23C 14/505* (2013.01); *C23C 16/00* (2013.01)

(58) Field of Classification Search
CPC .......... B29D 11/00153; B29D 11/0023; B65G 47/907; B65G 17/002; B65G 17/005; C23C 14/24; C23C 14/00; C23C 14/505; C23C 16/00; B25J 15/00; B25J 15/0028; B25J 15/08; B25J 15/103
USPC ............. 198/339.1, 343.2, 468.01; 279/2.17; 294/93
See application file for complete search history.

(56) References Cited

U.S. PATENT DOCUMENTS

| | | | | |
|---|---|---|---|---|
| 4,544,193 A | | 10/1985 | Dunn et al. | |
| 4,599,414 A | | 7/1986 | Sugimoto et al. | |
| 4,770,456 A | | 9/1988 | Phillips et al. | |
| 4,981,408 A | * | 1/1991 | Hughes .................. | B65G 37/02 414/217 |

(Continued)

*Primary Examiner* — Gregory W Adams
(74) *Attorney, Agent, or Firm* — Jerry Haynes Law

(57) ABSTRACT

An ophthalmic substrate conveyor and method of conveying ophthalmic substrates for vacuum deposition utilizes gravity and impulse action energy to convey an ophthalmic substrate to an adjacent vacuum deposition machine, for coating the ophthalmic substrate with an ophthalmic substance through physical vapor deposition. The conveyor provides a spring-loaded lens wheel that selectively retains the ophthalmic substrate during coating. The lens wheel rides a pair of inclined rails, urged by gravity, to a vacuum deposition machine that coats HEV absorbing material onto ophthalmic substrate. An escapement mechanism subassembly transfers impulse action energy to the lens wheel to regulate the speed and direction of the lens wheel across the inclined rails. A rotation servomechanism senses and rotates the lens wheel to the desired orientation during coating. A ring spreader actuator engages springs in the lens wheel to clamp and release the ophthalmic substrate. A control unit regulates servomechanism and ring spreader actuator.

19 Claims, 5 Drawing Sheets

100
116A
118A
106A
126A
124
134
154
122
120A
104
120B
102
152
116B
118B
150
130
132
126B
106B

(56) References Cited

U.S. PATENT DOCUMENTS

| | | | | |
|---|---|---|---|---|
| 4,995,148 | A | 2/1991 | Bonomi et al. | |
| 5,543,022 | A * | 8/1996 | Nguyen | G11B 17/02 118/728 |
| 5,768,768 | A | 6/1998 | Best | |
| 7,090,559 | B2 | 8/2006 | Vulich et al. | |
| 9,394,605 | B1 | 7/2016 | Kester et al. | |
| 9,580,805 | B2 | 2/2017 | Kester et al. | |
| 2010/0300840 | A1 * | 12/2010 | O'Brien | B65G 35/06 198/860.1 |
| 2011/0268548 | A1 * | 11/2011 | Doll | |

* cited by examiner

OPHTHALMIC SUBSTRATE CONVEYOR AND METHOD OF CONVEYING OPHTHALMIC SUBSTRATES FOR VACUUM DEPOSITION

CROSS-REFERENCE TO RELATED APPLICATIONS

This application claims the benefit of U.S. provisional application No. 62/735,690, filed Sep. 24, 2018 and entitled OPHTHALMIC SUBSTRATE CONVEYANCE CONVEYOR AND METHOD OF COATING THROUGH PHYSICAL VAPOR DEPOSITION, which provisional application is incorporated by reference herein in its entirety.

FIELD OF THE INVENTION

The present invention relates generally to an ophthalmic substrate conveyor and method of conveying ophthalmic substrates for vacuum deposition. More so, the present invention relates to a conveyor that is operational adjacent to a vacuum deposition machine to position, rotate, convey, and release an ophthalmic substrate, such as an optical lens, for vacuum deposition through use of a spring-loaded lens wheel that automatically retains and releases the ophthalmic substrate, a pair of inclined rails that use gravity to carry the spring-loaded lens wheel to the vacuum deposition machine, and an escapement mechanism subassembly operational along the inclined rails to transfer impulse action energy to the lens wheel for controlling direction and speed of conveyance; and further controllably rotates the ophthalmic substrate during coating.

BACKGROUND OF THE INVENTION

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Typically, abrasion-resistant coatings are applied to lens surfaces by spin coating, dip coating, spray coating, and flow coating techniques. These techniques have been successful when used to coat smooth surfaces, such as the optical surface of single vision spectacle lenses. Though physical vapor deposition a coating can be applied to the surface of a lens or other optical device in order to change one or more optical properties of the device.

In one example, an antireflective coating can be used to reduce surface reflections that occur at one or more interfaces between the lens and air. One such commonly used coating is an HEV absorbing material that is antireflective and transmits a substantial amount of light for the rest of spectrum. The HEV absorbing material allows an ophthalmic substrate, such as a glass lens, to selectively absorb blue light that falls in a specified wavelength.

Other proposals have involved vacuum deposition processes for ophthalmic substrates, such as lenses. The problem with these vacuum deposition processes is that they do not efficiently carry the ophthalmic substrates to the vacuum deposition machine. Also, the ophthalmic substrate is not rotated during the coating process. Even though the above cited gripping devices meets some of the needs of the market, an ophthalmic substrate conveyor and method of conveying ophthalmic substrates for vacuum deposition that is operational adjacent to a vacuum deposition machine to position, rotate, convey, and release an ophthalmic substrate, such as an optical lens, for vacuum deposition through use of a spring-loaded lens wheel that automatically retains and releases the ophthalmic substrate, a pair of inclined rails that use gravity to carry the spring-loaded lens wheel to the vacuum deposition machine, and an escapement mechanism subassembly operational along the inclined rails to transfer impulse action energy to the lens wheel for controlling direction and speed of conveyance is still desired.

SUMMARY

Illustrative embodiments of the disclosure are generally directed to an ophthalmic substrate conveyor and method of conveying ophthalmic substrates for vacuum deposition. The conveyor is operational adjacent to a vacuum deposition machine to position, rotate, convey, and release an ophthalmic substrate, such as an optical lens, for vacuum deposition. Primarily, the conveyor utilizes a spring-loaded lens wheel that automatically retains and releases the ophthalmic substrate, and a pair of inclined rails that use gravity to carry the spring-loaded lens wheel to the vacuum deposition machine. Also, a spring-loaded lens wheel controllably rotates the ophthalmic substrate during coating in a vacuum deposition machine, with the help of a rotation servomechanism and a control unit.

In some embodiments, the conveyor provides a spring-loaded lens wheel that selectively retains the ophthalmic substrate during coating. The lens wheel rides a pair of inclined rails, urged by gravitational force, to and from a vacuum deposition machine that coats the HEV absorbing material onto the ophthalmic substrate. An escapement mechanism subassembly transfers impulse action energy to the lens wheel to regulate the speed and direction of the lens wheel while moving across the inclined rails. A rotation servomechanism senses and rotates the position of the lens wheel to the desired orientation for optimal coating of the ophthalmic substrate. A ring spreader actuator engages springs in the lens wheel to clamp and release the ophthalmic substrate from the lens wheel.

In one aspect, an ophthalmic substrate conveyor, comprises:

an elongated frame;

a spring-loaded lens wheel comprising a disc and a plurality of springs, the springs operable to releasably fasten an ophthalmic substrate to the disc, whereby the spring-loaded lens wheel retains and radially articulates the ophthalmic substrate;

at least one drive actuator engaging the lens wheel, the drive actuator helping to drive the lens wheel along the rails;

at least one ring spreader actuator selectively engaging and disengaging the lens wheel, the ring spreader actuator causing the lens wheel to selectively release and clamp the ophthalmic substrate;

a pair of inclined rails disposed along the length of the frame, the inclined rails operable to carry the lens wheel to a vacuum deposition machine, whereby gravity at least partially urges the lens wheel longitudinally across the inclined rails; and an escapement mechanism subassembly operational along the inclined rails, the escapement mechanism subassembly transferring impulse action energy to the lens wheel, whereby the impulse action energy helps regulate the speed and direction of the lens wheel across the inclined rails.

In another aspect, the frame is defined by a body and opposing ends.

In another aspect, the conveyor further includes at least one rotation servomechanism engaging the springs of the lens wheel, the rotation servomechanism urging the lens wheel to radially articulate.

In another aspect, the conveyor further includes a control unit regulating the rotation servomechanism and ring spreader actuator.

In another aspect, the control unit comprises circuitry connected to the rotation servomechanism and ring spreader actuator.

In another aspect, the rotation servomechanism comprises a sensor to detect an angular position of the lens wheel.

In another aspect, the rotation servomechanism comprises an integral encoder operable to generate error-sensing negative feedback, the feedback helping to correct the angular position of the lens wheel.

In another aspect, the ring spreader actuator comprises a protruding member.

In another aspect, the protruding member axially extends towards the ring spreader actuator to urge the spring in the lens wheel away from the ophthalmic substrate, whereby the lens wheel releases the ophthalmic substrate.

In another aspect, the protruding member disengages from the springs, whereby the lens wheel clamps the ophthalmic substrate.

In another aspect, the ophthalmic substrate comprises a glass lens.

In another aspect, the vacuum deposition machine coats the ophthalmic substrate with an HEV absorbing material while the ophthalmic substrate is retained in the lens wheel.

One objective of the present invention is to carry an ophthalmic substrate for vacuum deposition through use of a pair of inclined rails that use gravity to carry the spring-loaded lens wheel to the vacuum deposition machine, and an escapement mechanism subassembly operational along the inclined rails to transfer impulse action energy to the lens wheel for controlling direction and speed of conveyance.

Another objective is to rotate the ophthalmic substrate before, during, and after coating while the ophthalmic substrate is on the inclined rail and retained in a lens wheel.

Another objective is to securely retain an ophthalmic substrate while it is being automatically coated.

Another objective is to increase productivity and product loss through more efficient coating means.

Another objective is to use gravity as a means of conveyance of the ophthalmic substrate.

Another objective is to enable scalability for increasing capacity of coating ophthalmic substrates.

Another objective is to reduce repetitive, manual labor while coating ophthalmic substrates.

Another objective is to provide an inexpensive to manufacture conveyor for ophthalmic substrates.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims and drawings.

BRIEF DESCRIPTION OF THE DRAWINGS

The invention will now be described, by way of example, with reference to the accompanying drawings, in which.

Like reference numerals refer to like parts throughout the various views of the drawings.

DETAILED DESCRIPTION OF THE INVENTION

Figure 1:
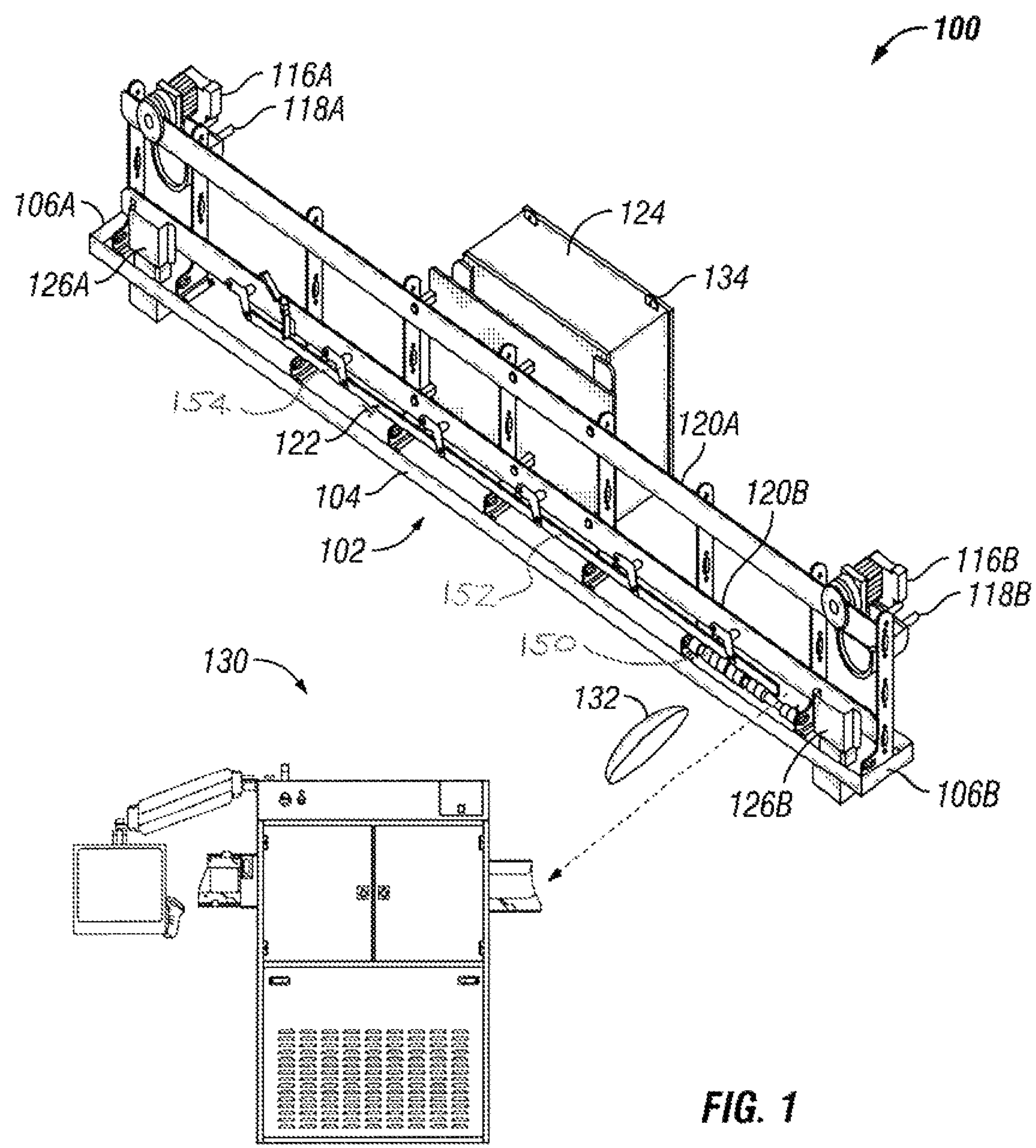
FIG. 1 illustrates a perspective view of an exemplary ophthalmic substrate conveyor, in accordance with an embodiment of the present invention.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims. For purposes of description herein, the terms "upper," "lower," "left," "rear," "right," "front," "vertical," "horizontal," and derivatives thereof shall relate to the invention as oriented in FIG. 1. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply exemplary embodiments of the inventive concepts defined in the appended claims. Specific dimensions and other physical characteristics relating to the embodiments disclosed herein are therefore not to be considered as limiting, unless the claims expressly state otherwise.

An ophthalmic substrate conveyor 100 and method 500 of conveying ophthalmic substrates for vacuum deposition is referenced in FIGS. 1-5. The ophthalmic substrate conveyor 100, hereafter "conveyor 100" utilizes gravity and impulse action energy to convey an ophthalmic substrate 132 to an adjacent vacuum deposition machine 130, for coating the ophthalmic substrate 132 with an ophthalmic substance through a vacuum deposition, such as physical vapor deposition with a high energy visible light (HEV) absorbing material. Also, a spring-loaded lens wheel 108 controllably rotates the ophthalmic substrate 132 during coating in the vacuum deposition machine, with the help of a rotation servomechanism 116*a-b* and a control unit 124.

In one possible embodiment of the conveyer 100, a spring-loaded lens wheel 108 automatically retains and releases the ophthalmic substrate 132 during conveyance and coating functions. A pair of inclined rails 120*a*, 120*b* carry the spring-loaded lens wheel—urged by gravity—to the vacuum deposition machine 130 for the appropriate coating process. An escapement mechanism subassembly 122 operational on the inclined rails 120*a-b*, and engaged with the lens wheel 108 transfers impulse action energy to the lens wheel 108 to regulate the speed and direction of the lens wheel 108 while riding across the inclined rails 120*a-b* with the ophthalmic substrate 132.

As referenced in FIG. 1, the conveyor 100 provides an elongated frame 102 that forms the structural foundation for the conveyor. The frame 102 is defined by an elongated body 104 and opposing ends 106*a-b*. In one embodiment, the body is level to a ground surface; whereby no inclination occurs in the frame itself. In some embodiments, the frame 102 may be used to support the components of the conveyor 100 while carrying the ophthalmic substrate 132 to and from a vacuum deposition machine 130. The frame 102 is aligned with a vacuum deposition machine 130 that transfers a coating onto the ophthalmic substrate 132, and a drying machine 136 that dries the ophthalmic substrate 132 after receiving the coating. The frame 102 may be rolled or positioned otherwise adjacent to the coating and drying machines. Suitable materials for the frame 102 may include, without limitation, steel, iron, titanium, metal alloys, and a rigid polymer.

In one non-limiting embodiment, the frame 102 supports a pair of inclined rails 120*a*, 120*b*. The rails are disposed longitudinally across the frame 102. In one embodiment, the rails 120*a-b* are fastened to the frame body 104 at a slope, so as to be inclined relative to the body 104. The inclined rails 120*a*, 120*b* are sloped, such that gravitational forces carry the lens wheel 108 to and from an adjacent vacuum deposition machine 130. The rails 120*a-b* are configured to carry a spring-loaded lens wheel 108 that retains the ophthalmic substrate 132.

In some embodiments, the rails 120*a*, 120*b* are flat and form a smooth surface. The rails 120*a-b* may also have flanges that allow the lens wheel 108 to ride. The rails 120*a-b* extend up to the vacuum deposition machine 130 and a dryer, which may include a hard coater and cure oven, or other coating mechanisms known in the art.

An escapement mechanism subassembly 122 is operational on the inclined rails 120*a-b*. The escapement mechanism subassembly 122 is engaged with the lens wheel 108. The escapement mechanism subassembly 122 is configured to generate and transfer impulse action energy to the lens wheel 108. This works to regulate the speed and direction of the lens wheel 108 while riding across the inclined rails 120*a-b*. As illustrated in FIG. 1, in one exemplary embodiment, the escapement mechanism subassembly 122 is a gravity escapement that uses a small weight or spring 150 to generate an impulse directly to the lens wheel 108. An elongated actuator shaft 152 may be engaged for axial displacement by the weight or spring 150. A plurality of actuator elements 154 may be pivotally attached to the actuator shaft 152. The actuator elements 154 may be pivotally mounted on the rail 120*b*. Accordingly, the actuator elements 154 may be configured to engage and transfer impulse action energy to the lens wheel 108, via axial displacement of the actuator shaft 152, responsive to dropping or expansion of the weight or spring 150. In other embodiments, other types of escapements may also be used.

Thus, two forces propel the lens wheel 108 towards the vacuum deposition machine 130. A gravitational force from the inclined disposition of the rails urges the lens wheel 108 (and the retained ophthalmic substrate 132) across the frame 102 for coating. And impulse action energy generated from the escapement mechanism subassembly 122 that regulates the speed and direction of the lens wheel 108. This dual force for conveyance is generally low-energy, and thereby cost effective for retaining and carrying ophthalmic substrates for treatment.

Figure 3:
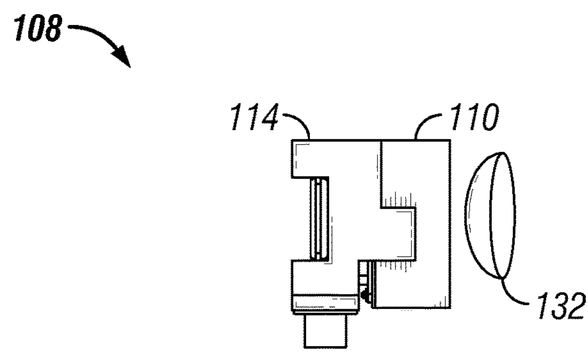
FIG. 3 illustrates a perspective view of an exemplary spring-loaded lens wheel, in accordance with an embodiment of the present invention.

As FIG. 3 illustrates, the lens wheel 108 is an automated mechanism that selectively and automatically retains and releases the ophthalmic substrate 132 for coating. The lens wheel 108 may be supported on the rails 120*a*, 120*b*, or on a separate support surface through a pair of adjustable arms. In one possible embodiment, the lens wheel 108 comprises a disc 110, and a plurality of springs 114. The lens wheel rotation servo 116*b* and the ring spreader actuator 118*b* enables radial articulation of the lens wheel 110. The springs 114 are operable to releasably fasten an ophthalmic substrate 132 to the disc 110.

Thus, the lens wheel 108 articulates radially in a first direction to retain the ophthalmic substrate 132 in a stable disposition while being coated with the HEV. The lens wheel 108 articulates radially in a second direction to release the ophthalmic substrate 132. The angular velocity of the rotation, and the direction may, however, be varied to accommodate different vacuum deposition processes and different types of ophthalmic substrates.

Looking again at FIG. 3, the lens wheel 108 is defined by a cylindrical shape that is sized to accommodate a circular ophthalmic substrate 132, such as a lens. In other embodiments however, the lens wheel 108 further comprises a protective body 104 guard, a pair of outer covers, a mount bracket that receives the ophthalmic substrate 132, and standoff members that enhance structural integrity.

Figure 2:
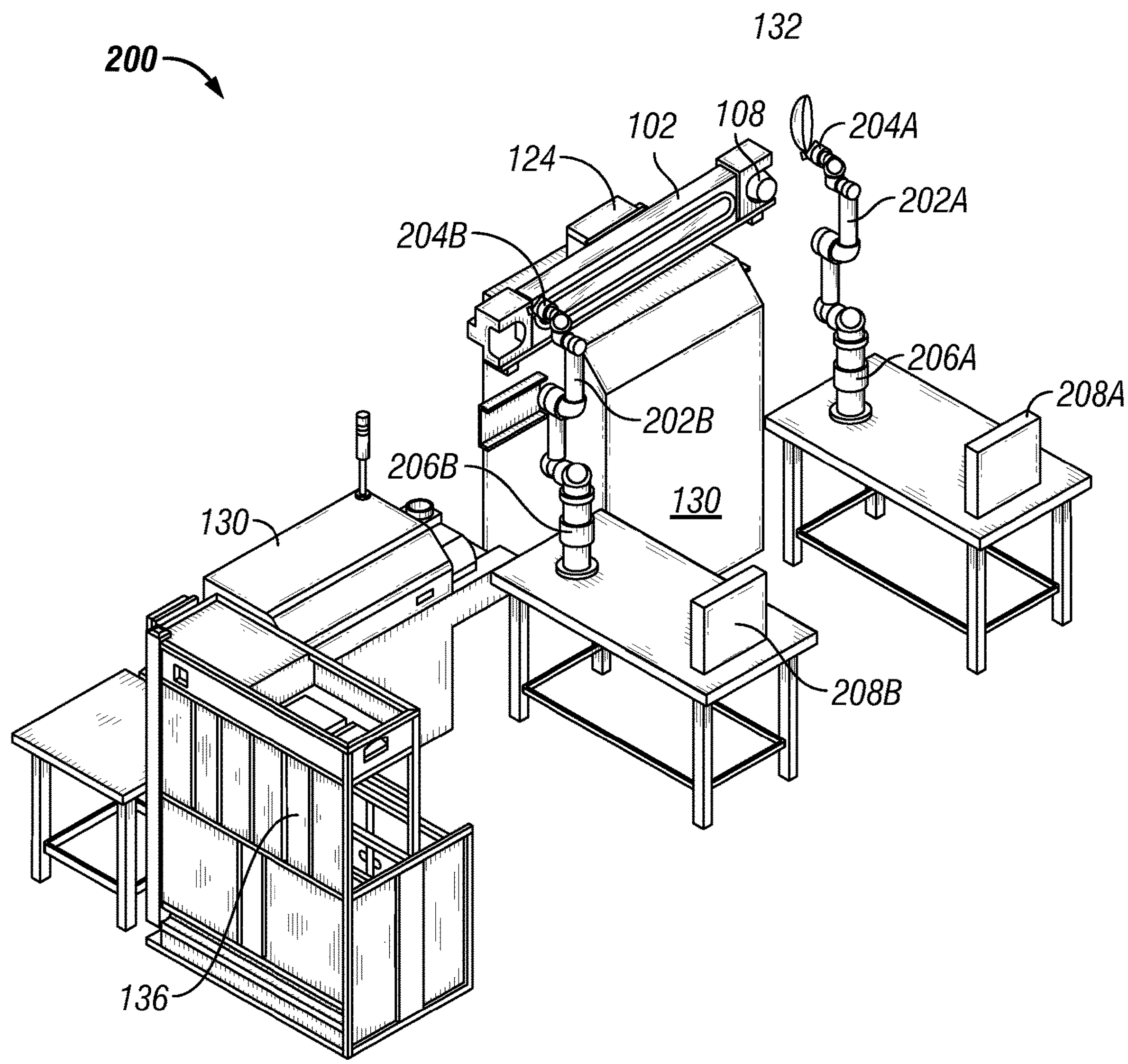
FIG. 2 illustrates a perspective view of the ophthalmic substrate conveyor, showing robot gripper arms for receiving the ophthalmic substrate from the lens wheel, in accordance with an embodiment of the present invention.

FIG. 2 illustrates a perspective view of an alternative embodiment of the ophthalmic substrate conveyor 200, showing a pair of robot gripper arms 202*a*, 202*b* that are operable to receive the ophthalmic substrate 132 from the lens wheel 108. In this configuration, the robot gripper arms 202*a-b* align with the lens wheel 108, and grip the ophthalmic substrate therefrom. A ring spreader actuator 118*a-b* releases the ophthalmic substrate from the lens wheel 108 for transfer. The robot gripper arms 202*a-b* may then carry the ophthalmic substrate 132 to the vacuum deposition machine 130 for treatment. In one embodiment, the robot gripper arms 202*a*, 202*b* have a rotatable mount base 206*a*, 206*b* that rotatably mounts to a table, and a radial robot gripper 204*a*, 204*b* that corresponds to the shape and dimensions of the spring-loaded lens wheel 108, so as to facilitate transfer of the ophthalmic substrate 132. At least one human machine interface may also be used for control of the robot gripper arms 202*a*, 202*b*.

Figure 4A:
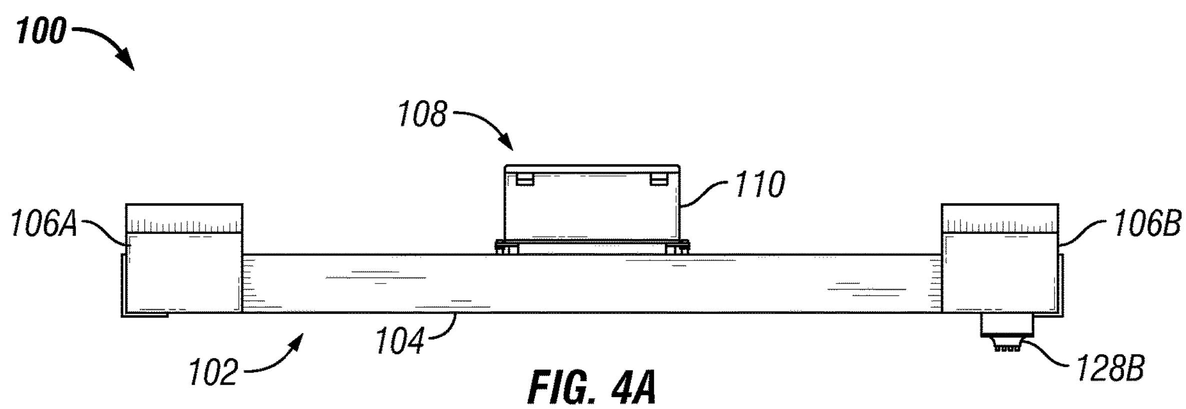
FIG. 4A illustrates a bottom view of the ophthalmic substrate conveyor shown in FIG. 1, in accordance with an embodiment of the present invention.
Figure 4B:
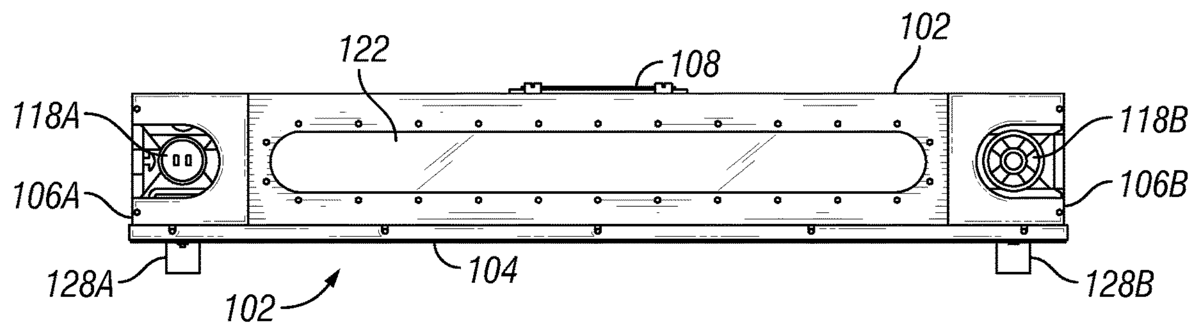
FIG. 4B illustrates a top view of the ophthalmic substrate conveyor shown in FIG. 1, in accordance with an embodiment of the present invention.
Figure 4C:
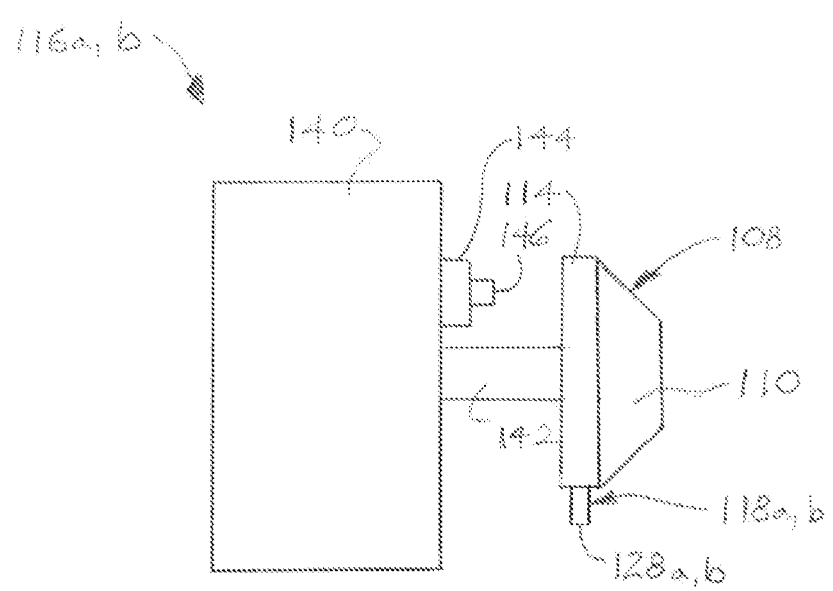
FIG. 4C illustrates a typical motor and drive shaft of the rotation servomechanism.

Turning now to FIGS. 3 and 4C, the conveyor 100 may further include at least one rotation servomechanism 116*a*, 116*b* that automatically rotates the lens wheel 108 to an optimal orientation for coating. The rotation servomechanism 116*a-b* rotates the spring-loaded lens wheel 108 at a predetermined orientation. The rotation servomechanism 116*a-b* also controls the mechanical position, speed, and other parameters of the lens wheel 108. As illustrated in FIG. 4C, in some embodiments, the rotation servomechanism 116*a-b* may include a motor 140 which engages the spring-loaded lens wheel 108 for rotation through a drive shaft 142.

In one embodiment, a pair of rotation servomechanisms 116*a-b* are disposed at the ends 106*a-b* of the frame 102. The rotation servomechanism 116*a-b* engages the springs 114 of the lens wheel 108. In one non-limiting embodiment, the rotation servomechanism 116*a-b* comprises a sensor 144 that detects the orientation of the lens wheel 108 and rotates to achieve optimal coating. For example, the rotation is preset to operate at a slow, 360° rotation that allows for uniform coating of the entire surface of the ophthalmic substrate 132. In some embodiments, the rotation servomechanism 116*a-b* may include an integral encoder 146. The integral encoder 146 may be operable to generate error-sensing negative feedback which helps to correct the angular position of the lens wheel 108.

As FIGS. 4A and 4B show, the conveyor 100 further comprises at least one ring spreader actuator 118*a*, 118*b* that engages the spring-loaded lens wheel 108 to enable clamping and releasing of the ophthalmic substrate 132. In one embodiment, a pair of ring spreader actuators 118*a*,118*b* disposed at the ends 106*a-b* of the frame 102. The ring spreader actuator 118*a-b* is configured to engage the springs 114, forcing the springs away from the disc of the lens wheel 108; thereby forcing the lens wheel 108 to release the ophthalmic substrate 132.

Specifically, the ring spreader actuator 118*a*, 118*b* comprises a protruding member 128*a*, 128*b*. The protruding member may include a bar, a link, or other mechanical abutment mechanism. The protruding member 128*a-b* axially extends and retracts to urge the springs 114 in the lens wheel 108 away from the ophthalmic substrate 132. This causes the springs 114 to release from the ophthalmic substrate 132. Conversely, the ring spreader actuator 118*a*, 118*b* also causes the lens wheel 108 to grip the ophthalmic substrate 132 by disengaging from the springs 114. The spring tension forces the springs 114 onto the disc 110; and thereby gripping the ophthalmic substrate 132 to the lens wheel 108.

In some embodiments, the conveyor 100 further provides a control unit 124 that regulates the rotation servomechanism 116*a-b* and ring spreader actuator 118*a-b*. The control unit 124 allows an operator to manipulate the lens wheel 108, so that the ophthalmic substrate 132 is coated to a desired specification. This may include the rotational speed of the rotation servomechanism 116*a-b*. The control unit 124 also serves to control the ring spreader actuator 118*a-b* for clamping and releasing the ophthalmic substrate 132 in the spring-loaded lens wheel 108.

In one non-limiting embodiment, the control unit 124 comprises circuitry 134 connected to the rotation servomechanism 116*a*, 116*b* and ring spreader actuator 118*a-b*. The control unit 124 may also include a power source, or be connected to an external power source. Various processors, display screens, protective doors, and insulative materials may also be used in the control unit 124.

Figure 5:
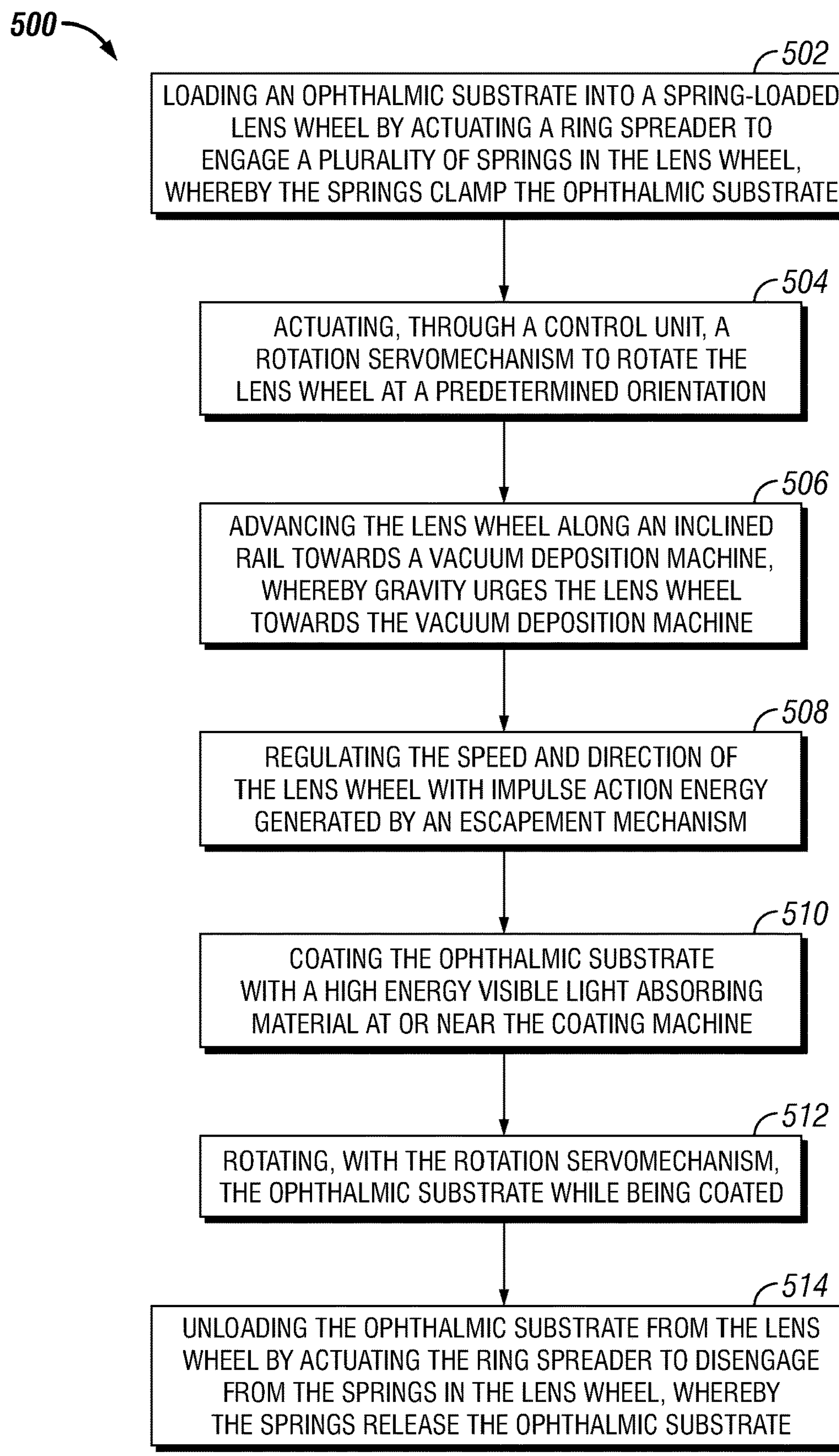
FIG. 5 illustrates a flowchart of an exemplary method of coating through physical vapor deposition, in accordance with an embodiment of the present invention.

FIG. 5 illustrates a flowchart of an exemplary method 500 of coating through physical vapor deposition. The method 500 is operational with use of ophthalmic substrate conveyor 100 and a vacuum deposition machine 130 used to coat ophthalmic substrates. The method 500 includes an initial Step 502 of loading an ophthalmic substrate into a spring-loaded lens wheel 108 by actuating a ring spreader to engage a plurality of springs 114 in the lens wheel 108, whereby the springs 114 clamp the ophthalmic substrate. A Step 504 may further include actuating, through a control unit 124, a rotation servomechanism 116*a*, 116*b* to rotate the lens wheel 108 at a predetermined orientation.

A Step 506 may include advancing the lens wheel along an inclined rail towards a vacuum deposition machine, whereby gravity urges the lens wheel towards the vacuum deposition machine. Another Step 509 comprises regulating the speed and direction of the lens wheel with impulse action energy generated by an escapement mechanism. A Step 510 includes coating the ophthalmic substrate with a high energy visible light absorbing material at or near the vacuum deposition machine.

In some embodiments, a Step 512 may include rotating, with the rotation servomechanism, the ophthalmic substrate while being coated. A final Step 514 comprises unloading the ophthalmic substrate from the lens wheel 108 by actuating the ring spreader to disengage from the springs 114 in the lens wheel 108, whereby the springs 114 release the ophthalmic substrate.

In conclusion, the ophthalmic substrate conveyor 100 and method 500 of conveying ophthalmic substrates for vacuum deposition is configured to leverage gravity and impulse action energy to convey an ophthalmic substrate to an adjacent vacuum deposition machine for coating. The conveyor provides a spring-loaded lens wheel 108 that selectively retains the ophthalmic substrate during coating. The lens wheel rides a pair of inclined rails 120*a-b*, urged by gravity, to a vacuum deposition machine 130 that coats HEV absorbing material onto ophthalmic substrate 132.

Continuing, an escapement mechanism subassembly 122 transfers impulse action energy to the lens wheel to regulate the speed and direction of the lens wheel 108 across the inclined rails 120*a-b*. A rotation servomechanism 118*a-b* senses and rotates the lens wheel to the desired orientation during coating. A ring spreader actuator 118*a-b* engages springs in the lens wheel to clamp and release the ophthalmic substrate. A control unit 124 regulates servomechanism and ring spreader actuator. In this manner, the present invention can carry an ophthalmic substrate for vacuum deposition through use of a pair of inclined rails that use gravity to carry the spring-loaded lens wheel to the vacuum deposition machine, and an escapement mechanism subassembly operational along the inclined rails to transfer impulse action energy to the lens wheel for controlling direction and speed of conveyance.

These and other advantages of the invention will be further understood and appreciated by those skilled in the art by reference to the following written specification, claims and appended drawings.

Because many modifications, variations, and changes in detail can be made to the described preferred embodiments of the invention, it is intended that all matters in the foregoing description and shown in the accompanying drawings be interpreted as illustrative and not in a limiting sense. Thus, the scope of the invention should be determined by the appended claims and their legal equivalence.

What is claimed is:

1. An ophthalmic substrate conveyor, the conveyor comprising:

an elongated frame;

a spring-loaded lens wheel on the frame, the lens wheel comprising a disc and a plurality of springs, the springs operable to releasably fasten an ophthalmic substrate to the disc, whereby the spring-loaded lens wheel retains and radially articulates the ophthalmic substrate;

at least one ring spreader actuator selectively engaging and disengaging the lens wheel, the ring spreader actuator causing the lens wheel to selectively release and clamp the ophthalmic substrate, the at least one ring spreader actuator comprising a protruding member including a bar or link configured to selectively engage and disengage the lens wheel;

a pair of inclined rails disposed along the length of the frame, the inclined rails operable to carry the lens wheel to a vacuum deposition machine, whereby gravity at least partially urges the lens wheel longitudinally across the inclined rails; and an escapement mechanism subassembly operational along the inclined rails, the escapement mechanism subassembly engaged with the lens wheel and configured to transfer impulse action energy to the lens wheel, whereby the impulse action energy helps regulate the speed and direction of the lens wheel across the inclined rails, the escapement mechanism subassembly comprising a weight or spring, an elongated actuator shaft engaged for axial displacement by the weight or spring and a plurality of actuator elements pivotally attached to the actuator shaft, the plurality of actuator elements pivotally carried by one of the pair of inclined rails, the plurality of actuator elements configured to engage and transfer impulse action energy to the lens wheel via axial displacement of the actuator shaft responsive to dropping or expansion of the weight or spring.

2. The conveyor of claim 1, wherein the frame is defined by a body and opposing ends.

3. The conveyor of claim 1, further comprising at least one rotation servomechanism engaging the springs of the lens wheel, the rotation servomechanism configured to rotate the lens wheel to a desired orientation for optimal coating of the ophthalmic substrate, the rotation servomechanism comprising a motor drivingly engaging the spring-loaded lens wheel for rotation.

4. The conveyor of claim 3, further comprising a control unit regulating the rotation servomechanism and ring spreader actuator.

5. The conveyor of claim 4, wherein the control unit comprises circuitry connected to the rotation servomechanism and the ring spreader actuator.

6. The conveyor of claim 5, wherein the rotation servomechanism comprises a sensor to detect an angular position of the lens wheel.

7. The conveyor of claim 6, wherein the rotation servomechanism comprises an integral encoder operable to generate error-sensing negative feedback, the feedback helping to correct the angular position of the lens wheel.

8. The conveyor of claim 1, wherein the protruding member axially extends towards the ring spreader actuator to urge the spring in the lens wheel away from the ophthalmic substrate, whereby the lens wheel releases the ophthalmic substrate.

9. The conveyor of claim 8, wherein the protruding member disengages from the springs, whereby the lens wheel clamps the ophthalmic substrate.

10. The conveyor of claim 1, further comprising a pair of robot gripper arms operable to receive the ophthalmic substrate from the lens wheel for transfer to the vacuum deposition machine.

11. The conveyor of claim 10, wherein the robot gripper arms comprise a rotatable mount base being rotatably mounted, and a radial robot gripper corresponding to the lens wheel.

12. The conveyor of claim 11, further comprising at least one human machine interface being operable to control the robot gripper arms.

13. The conveyor of claim 1, wherein the vacuum deposition machine coats the ophthalmic substrate with an HEV absorbing material while the ophthalmic substrate is retained in the lens wheel.

14. An ophthalmic substrate conveyor, the conveyor comprising:

a vacuum deposition machine being operable to coat an ophthalmic substrate;

a dryer being operable to dry the ophthalmic substrate;

an elongated frame defined by a body and opposing ends;

a spring-loaded lens wheel comprising a disc and a plurality of springs, the springs operable to releasably fasten an ophthalmic substrate to the disc, whereby the spring-loaded lens wheel retains and radially articulates the ophthalmic substrate;

at least one rotation servomechanism engaging the springs of the lens wheel, the rotation servomechanism configured to rotate the lens wheel to a desired orientation for optimal coating of the ophthalmic substrate, the rotation servomechanism comprising a motor drivingly engaging the spring-loaded lens wheel for rotation;

at least one ring spreader actuator selectively engaging and disengaging the lens wheel, the ring spreader actuator causing the lens wheel to selectively release and clamp the ophthalmic substrate, the ring spreader actuator comprising a protruding member including a bar or link configured to selectively engage and disengage the lens wheel;

the protruding member axially extending towards the ring spreader actuator to urge the spring in the lens wheel away from the ophthalmic substrate, whereby the lens wheel releases the ophthalmic substrate, the protruding member disengaging from the springs, whereby the lens wheel clamps the ophthalmic substrate;

a pair of inclined rails disposed along the length of the frame, the inclined rails operable to carry the lens wheel to the vacuum deposition machine, whereby gravity at least partially urges the lens wheel longitudinally across the inclined rails;

an escapement mechanism subassembly operational along the inclined rails, the escapement mechanism subassembly engaged with the lens wheel and configured to transfer impulse action energy to the lens wheel, whereby the impulse action energy helps regulate the speed and direction of the lens wheel across the inclined rails, the escapement mechanism subassembly comprising a weight or spring, an elongated actuator shaft engaged for axial displacement by the weight or spring and a plurality of actuator elements pivotally attached to the actuator shaft, the plurality of actuator elements pivotally carried by one of the pair of inclined rails, the plurality of actuator elements configured to engage and transfer impulse action energy to the lens wheel via axial displacement of the actuator shaft responsive to dropping or expansion of the weight or spring; and a control unit regulating the rotation servomechanism and ring spreader actuator.

15. The conveyor of claim 14, wherein the rotation servomechanism comprises a sensor to detect an angular position of the lens wheel, and an integral encoder operable to generate error-sensing negative feedback, the feedback helping to correct the angular position of the lens wheel.

16. The conveyor of claim 14, further comprising a pair of robot gripper arms operable to receive the ophthalmic substrate from the lens wheel for transfer to the vacuum deposition machine, the robot gripper arms comprising a rotatable mount base being rotatably mounted, and a radial robot gripper corresponding to the lens wheel.

17. The conveyor of claim 16, further comprising at least one human machine interface being operable to control the robot gripper arms.

18. The conveyor of claim 14, wherein the vacuum deposition machine coats the ophthalmic substrate with an HEV absorbing material while the ophthalmic substrate is retained in the lens wheel.

19. A method of conveying ophthalmic substrates for vacuum deposition, the method comprising:

loading an ophthalmic substrate into a spring-loaded lens wheel by actuating a ring spreader to engage a plurality of springs in the lens wheel, whereby the springs clamp the ophthalmic substrate;

actuating, through a control unit, a rotation servomechanism to rotate the lens wheel at a predetermined orientation;

advancing the lens wheel along an inclined rail towards a vacuum deposition machine, whereby gravity urges the lens wheel towards the vacuum deposition machine;

regulating the speed and direction of the lens wheel with impulse action energy generated by an escapement mechanism subassembly;

coating the ophthalmic substrate with a high energy visible light absorbing material at or near the vacuum deposition machine;

rotating, with the rotation servomechanism, the ophthalmic substrate while being coated; and unloading the ophthalmic substrate from the lens wheel by actuating the ring spreader to disengage from the springs in the lens wheel, whereby the springs release the ophthalmic substrate.

* * * * *